United States Patent [19]

Kurita

[11] Patent Number: 5,299,032
[45] Date of Patent: Mar. 29, 1994

[54] IMAGE PICK UP APPARATUS
[75] Inventor: Susumu Kurita, Kanagawa, Japan
[73] Assignee: Sony Corporation, Tokyo, Japan
[21] Appl. No.: 826,828
[22] Filed: Jan. 28, 1992
[30] Foreign Application Priority Data
  Jan. 31, 1991 [JP] Japan .................. 3-032081
[51] Int. Cl.⁵ .................. H04N 1/04; H04N 3/14; H04N 5/335
[52] U.S. Cl. .................. 358/482; 358/483; 328/165; 348/250
[58] Field of Search .................. 358/482, 483, 213.11, 358/213.15, 213.16, 513, 463; 377/60, 63; 328/165; 307/520

[56] References Cited
U.S. PATENT DOCUMENTS

| | | | |
|---|---|---|---|
| 4,511,804 | 4/1985 | Ozawa | 358/482 |
| 4,683,580 | 7/1987 | Matsunaga | 377/60 |
| 4,733,097 | 3/1988 | Iwabuchi et al. | |
| 4,845,382 | 7/1989 | Eouzan et al. | |
| 5,172,249 | 12/1992 | Hashimoto | 358/482 |

FOREIGN PATENT DOCUMENTS
0243255 10/1987 European Pat. Off. .

OTHER PUBLICATIONS

IBM Technical Disclosure Bulletin vol. 16, No. 4, Sep. 1973, New York, US pp. 1099-1100 Chai et al 'Noise Compensation for Charge-Coupled Devices'.
Electronics International vol. 48, No. 17, Aug. 21, 1975, New York US p. 9E 'Image Sensor has High Contrast Range'.

Primary Examiner—Edward L. Coles, Sr.
Assistant Examiner—Thomas D. Lee
Attorney, Agent, or Firm—William S. Frommer; Alvin Sinderbrand

[57] ABSTRACT

An image pick up apparatus according to this invention comprises an imaging device for outputting video signals by driving a solid-state imaging element on the basis of a plurality of driving pulses, a noise synthesizer for synthesizing noise components contained in the plurality of driving pulses, and a subtracter for subtracting output signals of the noise synthesizer from the video signals. Signals synthesized with the noise components contained in the driving pulses for driving the solid-state imaging element are subtracted from the video signals transmitted from the imaging device, thereby removing the noise components of the video signals.

3 Claims, 3 Drawing Sheets

IMAGE PICK UP APPARATUS

BACKGROUND OF THE INVENTION

This invention relates to an image pick up apparatus, and more particularly is suitable for application, for example, in a television (TV) camera system.

Some of conventional TV camera systems involve the use of a CCD (charge coupled device) imaging element.

To be specific, as illustrated in FIG. 1, video information L0 condensed through a lens 2 at first undergoes an irradiation of a CCD imaging element 3 in such a CCD camera system 1. A video detection signal S0 obtained as a result of this is inputted to a CDS (correlated double sampling) circuit 4.

The CDS circuit 4 sample-holds the video detection signal S0 at a predetermined timing and generates a video signal S1. This video signal S1 is transmitted to a signal processing circuit of the subsequent stage.

Inputted via a driver 6 to the CCD imaging element 3 are driving pulses consisting of first, second and last horizontal transfer pulses H1, H2, LH and reset pulses RP which are transmitted from a timing generation circuit 5 as disclosed in Japanese Patent Laid-Open Publication No. 61-273079. The video information L0 is read at timings corresponding to a television system, thereby generating the video detection signals S0.

Inputted also to the CDS circuit 4 are first and second sampling pulses SP1, SP2 at timings corresponding to the horizontal transfer pulses H1, H2, LH and the reset pulses RP.

The CDS circuit 4 thereby sampling-holds the respective video detection signals S0 at timings of a signal level and a reference level. Subtraction thereof is effected, whereby the video signals S1 composed of signal level components of the video detection signals S0 can be generated.

If the thus constructed CCD camera system 1 is employed as a TV camera based on, e.g., a high-definition television system, for instance, shading or the like takes place because of the noise components due to entrances of the driving pulses H1, H2, LH, RP transmitted from the timing generation circuit 5. This results in a deterioration of an S/N ratio. The video signal S1 declines in terms of image quality.

The shading noise due to the horizontal transfer pulses H1 and H2 is generated as shown in FIGS. 2(A) to 2(C).

There may be no trouble in the case where the horizontal transfer pulses H1 and H2 have the identical level and the exactly opposite phase each other, because the horizontal transfer pulses entering into the CCD output signal cancel each other.

But actually, the phases of the horizontal transfer pulses H1 and H2 tend to have phase errors of rising edges on re-generating after the horizontal blanking period $T_{HBLK}$ as shown in FIGS. 2(A) and 2(B). AS the result the shading noise $S_{SHD}$ is generated as shown in FIG. 2(C).

This problem arises even in the standard television system of NTSC, etc. As compared with the high-definition television system, however, frequencies of the driving pulses H1, H2, LH, RP are low enough so that real time correction is unnecessary. This can be sufficiently corrected even in the signal processing circuit of the subsequent stage.

In the case of the TV camera of the high-definition television system, however, the frequencies of the driving pulses H1, H2, LH, RP increase corresponding to the horizontal frequencies. There exists such a problem that no correction can be made by the signal processing circuit of the subsequent stage unless the correction is effected in real time.

SUMMARY OF THE INVENTION

In view of the foregoing, an object of this invention is to provide an image pick up apparatus capable of removing noise components of video signals which are produced due to entrances of driving pulses.

The foregoing object and other objects of the invention have been achieved by the provision of an image pick up apparatus comprising: imaging means 3, 4 for outputting video signals S1 by driving a solid-state imaging element on the basis of a plurality of driving pulses H1, H2, LH, RP; noise synthesizing means 13, 14, 15 for synthesizing noise components H10, H20, LH0, RP0 which are contained in the plurality of driving pulses H1, H2, LH, RP; and a subtracting means 11 for subtracting output signals SD of the noise synthesizing means 13, 14, 15 from the video signals S1.

The signals SD synthesized with the noise components H10, H20, LH0, RP0 contained in the driving pulses H1, H2, LH, RP for driving the solid-state imaging element are subtracted from the video signals S1 transmitted from the imaging means 3, 4. The noise components of the video signals S1 can be thereby removed.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 1:
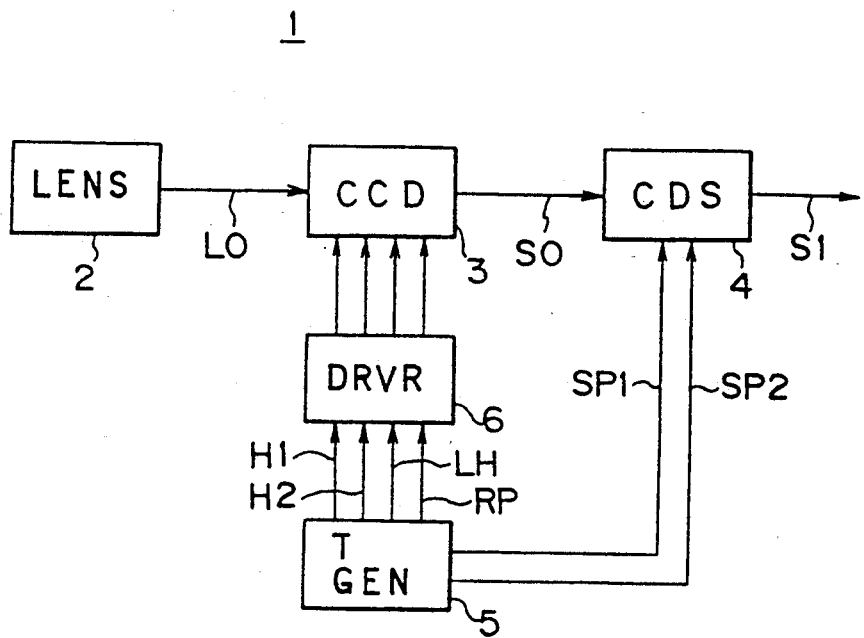
FIG. 1 is a block diagram depicting a construction of a conventional CCD camera system.
Figure 2:
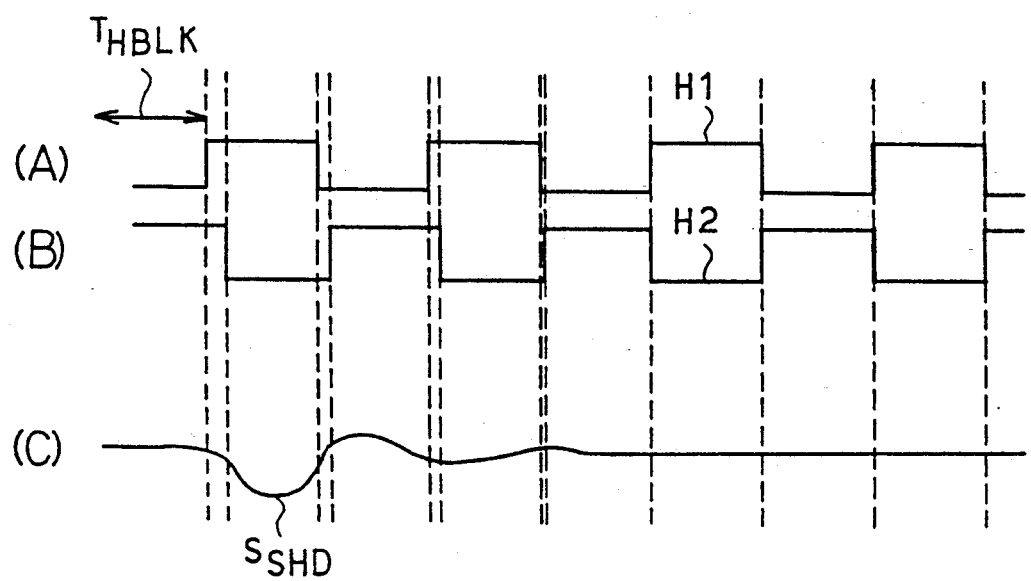
FIGS. 2(A) to 2(C) are time charts illustrating a shading noise due to horizontal transfer pulses.
Figure 3:
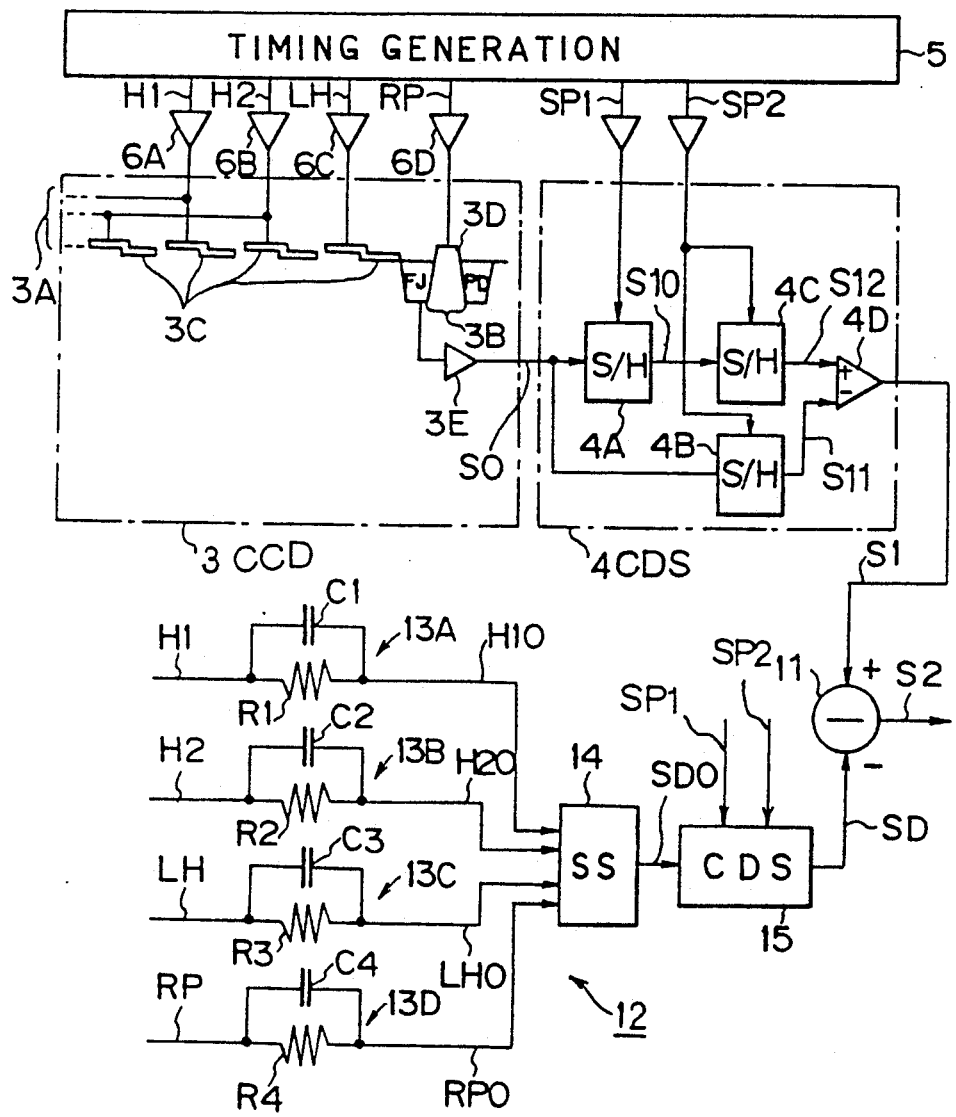
FIG. 3 is a block diagram illustrating a construction of a CCD camera system in one embodiment of the present invention.

Preferred embodiments of this invention will be described with reference to the accompanying drawings:

Referring to FIG. 3 in which portions corresponding to those in FIG. 1 are denoted by the same symbols, a CCD camera system consisting of an image pick up apparatus according to the present invention is generally designated at 10. First, second and last horizontal transfer pulses H1, H2, LH are inputted from a timing generation circuit 5 via drivers 6A, 6B, 6C to a horizontal output register 3A of a CCD imaging element 3. Similarly, reset pulses RP are inputted from the timing generation circuit 5 via driver 6D to an output stage 3B.

These horizontal transfer pulses H1, H2, LH are composed of pulse signals which each assumes a rectangular waveform and sequentially alternately rise. Each of the pulses is applied to an electrode 3C corresponding to the horizontal output register 3A. Signal electric charges corresponding to pieces of video information L0 accumulated in the horizontal output register 3A are thereby sequentially transferred.

The last horizontal transfer pulses LH drive only the last horizontal transfer register other than the remain horizontal transfer register so that no pulses supplied to the dull to be able to surely output electric changes transfered.

The reset pulses RP are applied to a precharge gate 3D of the output stage 3B. In consequence of this, the signals detected in the output stage 3B are transmitted as the video detection signals S0 via a buffer 3E to CDS4.

In CDS4, the video detection signals S0 are inputted to first and second sample hold circuits 4A, 4B.

A first sampling pulse SP1 inputted to the first sample hold circuit 4A is arranged to rise at a timing of the reference level of the video detection signals S0. A reference level signal S10 of the video detection signal S0 is thereby inputted to a subsequent third sample hold circuit 4C.

A second sampling pulse SP2 inputted to each of the second and third sample hold circuits 4B, 4C is arranged to rise at a timing of the signal level of the video detection signal S0.

The second sample hold circuit 4B sample-holds the signal level of the video detection signal S0, thereby obtaining a video detection signal S11. The video detection signal S11 is inputted to an inversion input terminal of a differential amplifier circuit 4D.

The third sample hold circuit 4C re-samples the reference level signal S10 at the timing of the signal level of the video detection signal S0. A second reference level signal S12 obtained as a result of this is inputted to a non-inversion input terminal of the differential amplifier circuit 4D.

Consequently, the differential amplifier circuit 4D subtracts the video detection signal S11 from the second reference level signal S12 and simultaneously effects inversion-amplification thereof. The video signal S1 thus obtained from the signal level components of the video detection signal S0 is transmitted as an output of CDS4.

In case of this embodiment, the video signal S1 transmitted from CDS4 is temporarily inputted to the subtraction circuit 11. Inputted to this subtraction circuit 11 is a second shading signal SD detected by a shading detection circuit 12. The second shading signal SD is subtracted from the video signal S1.

As a result of this, a second video signal S2 obtained by shading-correcting the video signal S1 in real time is transmitted to a subsequent signal processing circuit.

As a matter of fact, in this shading detection circuit 12, the driving pulses H1, H2, LH, RP transmitted from the timing generation circuit 5 are inputted to proportional differentiation circuits 13A, 13B, 13C, 13D wherein resistances R1, R2, R3, R4 and capacitors C1, C2, C3, C4 are connected in parallel to each other.

These proportional differentiation circuits 13A, 13B, 13C, 13D adjust the relative levels of the shading components contained in the respective driving pulses H1, H2, LH, RP. Shading component signals H10, H20, LH0, RP0 obtained as a consequence of this are inputted to a signal synthesizing circuit 14.

The signal synthesizing circuit 14 synthesizes the shading component signals H10, H20, LH0, RP0 to generate a first shading signal SD0. This shading signal SD0 is transmitted to CDS15.

This CDS15 is also, as in the same way with CDS4 described above, arranged to operate corresponding to the first and second sampling pulses SP1, SP2 transmitted from the timing generation circuit 5. Thereby the second shading signal SD having the same phase and level as the shading signal SD superimposed upon the video signal S1 has is inputted to the subtraction circuit 11.

With this arrangement, it is possible to correct shading in real time by effectively removing the noise components produced due to the entrances of the horizontal transfer pulses H1, H2, LH and reset pulses RP with respect to the video detection signals S0 and also improve the S/N ratio of the second video signal S2 to be outputted.

Subtracted from the video signal S1 transmitted via CCD3 and CDS4 according to the construction given above is the shading signal SD synthesized with the shading components H10, H20, LH0, RP0 contained in the driving pulses H1, H2, LH, RP for driving CCD3. It is therefore possible to attain the CCD camera system 10 capable of eliminating the noise components of the video signal S1 and at the same time executing shading correction in real time. The CCD camera system 10 optimal to the television camera system based on the high-definition television system can be thus actualized.

The embodiment discussed above has dealt with a case where the present invention is applied to the television camera system. The present invention is not limited to this but is suitable for applications widely to a variety of image pick up apparatus such as an electronic still camera, etc.

As discussed above, according to the present invention, the signal synthesized with the noise components contained in the driving pulses for driving the solid-state imaging element is subtracted from the video signal transmitted from the imaging means. The image pick up apparatus capable of removing the noise components of the video signals are thereby attainable.

While there has been described in connection with the preferred embodiments of the invention, it will be obvious to those skilled in the art that various changes and modifications may be made therein without departing from the invention, and it is aimed, therefore, to cover in the appended claims all such changes and modifications as fall within the true spirit and scope of the invention.

What is claimed is:

1. An image pick up apparatus having a charge coupled device for generating a video signal comprising:
    means for supplying drive pulses to said charge coupled device to drive the same;
    differentiation means for differentiating said drive pulses to produce differentiated drive pulse signal components;
    producing means for producing a compensating signal corresponding to a noise component of said video signal associated with said drive pulses based on said differentiated drive pulse signal components; and
    subtracting means for subtracting said compensating signal from said video signal to suppress said noise component in said video signal.

2. The image pick up apparatus according to claim 1, in which said drive pulses include horizontal transfer pulses and a reset pulse.

3. An image pick up apparatus according to claim 1 further comprising:

a first correlated doubled sampling circuit coupled with said charge coupled device for sampling said video signal; and a second correlated double sampling circuit coupled with said producing means for sampling said compensating signal;

said subtracting means being operative to subtract the compensating signal sampled by the second correlated double sampling circuit from the video signal sampled by the first correlated double sampling circuit to suppress the noise component in the sampled video signal.

* * * * *